US008133322B2

(12) United States Patent  (10) Patent No.: US 8,133,322 B2
Nakamura et al.  (45) Date of Patent: Mar. 13, 2012

(54) APPARATUS FOR INVERTED MULTI-WAFER MOCVD FABRICATION

(75) Inventors: Shuji Nakamura, Santa Barbara, CA (US); Steven DenBaars, Goleta, CA (US); Max Batres, Santa Barbara, CA (US); Michael Coulter, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/256,814

(22) Filed: Sep. 27, 2002

(65) Prior Publication Data

US 2004/0060518 A1  Apr. 1, 2004

Related U.S. Application Data

(60) Provisional application No. 60/325,637, filed on Sep. 29, 2001.

(51) Int. Cl.
*C23C 16/455* (2006.01)
*C23C 16/458* (2006.01)
*C23C 16/46* (2006.01)
*C23C 16/06* (2006.01)
*C23C 16/22* (2006.01)

(52) U.S. Cl. ... 118/715; 118/730; 118/725; 156/345.33; 156/345.34; 156/345.55; 156/345.52

(58) Field of Classification Search ....... 156/345.51–55, 156/345.29, 345.33, 345.34, 345.35, 345.36, 156/345.26; 118/724–732, 715, 50
See application file for complete search history.

(56) References Cited

U.S. PATENT DOCUMENTS 3,633,537 A  1/1972  Howe ............................. 118/48

(Continued)

FOREIGN PATENT DOCUMENTS

CN  1170048 A  1/1998

(Continued)

OTHER PUBLICATIONS

Official Notice of Rejection and Comments, Dated: Aug. 1, 2008, Japanese Application 2003-532724.

(Continued)

*Primary Examiner* — Rudy Zervigon
(74) *Attorney, Agent, or Firm* — Koppel, Patrick, Heybl & Philpott

(57) ABSTRACT

A semiconductor fabrication reactor according to the invention comprises a rotatable susceptor mounted to the top of a reactor chamber. One or more wafers are mounted to a surface of the susceptor and the rotation of the susceptor causes the wafers to rotate within the chamber. A heater heats the susceptor and a chamber gas inlet allows semiconductor growth gasses into the reactor chamber to deposit semiconductor material on said wafers. A chamber gas outlet is included to allow growth gasses to exit the chamber. In a preferred embodiment, the inlet is at or below the level of said wafers and the outlet is preferably at or above the level of the wafers. A semiconductor fabrication system according to the invention comprises a source of gasses for forming epitaxial layers on wafers and a source of gasses for dopants in said epitaxial layers. A gas line carries the dopant and epitaxial source gasses to a reactor for growing semiconductor devices on wafers, and the source gasses in the gas line are injected into the reactor chamber through a reactor inlet. The reactor comprises an inverted susceptor mounted in a reactor chamber that is capable of rotating. One or more wafers are mounted to a surface of the susceptor, the rotation of the susceptor causing the wafers to rotate within the chamber. A heater heats the susceptor and the source gasses deposit semiconductor material on the wafers.

74 Claims, 5 Drawing Sheets

U.S. PATENT DOCUMENTS

| | | | |
|---|---|---|---|
| 3,696,779 A * | 10/1972 | Murai et al. | 118/725 |
| 3,916,822 A | 11/1975 | Robinson | 118/49 |
| 3,922,467 A | 11/1975 | Pinchon | 428/411 |
| 4,062,318 A | 12/1977 | Ban et al. | 118/49 |
| 4,279,947 A | 7/1981 | Goldman et al. | 427/255.2 |
| 4,599,135 A * | 7/1986 | Tsunekawa et al. | 216/37 |
| 5,173,336 A | 12/1992 | Kennedy | 427/248.1 |
| 5,338,363 A * | 8/1994 | Kawata et al. | 118/725 |
| 5,445,677 A * | 8/1995 | Kawata et al. | 118/724 |
| 5,672,204 A * | 9/1997 | Habuka | 117/204 |
| 5,938,850 A | 8/1999 | Arami et al. | 118/715 |
| 6,239,043 B1 | 5/2001 | Lai | 438/782 |
| 6,454,864 B2 * | 9/2002 | Wytman | 118/728 |
| 6,506,450 B2 | 1/2003 | Jurgensen et al. | 427/248 |

FOREIGN PATENT DOCUMENTS

| | | |
|---|---|---|
| DE | 0811702 A | 12/1997 |
| EP | 0811702 A | 12/1997 |
| FR | 1462335 | 4/1966 |
| FR | A-1 462 335 | 4/1966 |
| JP | 56-073694 | 6/1981 |
| JP | 6115976 | 1/1986 |
| JP | 62-023108 | 1/1987 |
| JP | 01-300516 | 12/1989 |
| JP | 4128379 | 4/1992 |
| JP | 09-063967 | 3/1997 |
| JP | 9266173 | 10/1997 |

OTHER PUBLICATIONS

Patent Abstracts of Japan, Publication No. 56-073694, Date: Jun. 18, 2981.
Patent Abstracts of Japan, Publication No. 09-063967, Date: Mar. 7, 1997.
Patent Abstracts of Japan, Publication No. 62-023108, Date: Jan. 31, 1987.
Patent Abstracts of Japan, Publication No. 01-300516, Date: Dec. 5, 1989.
Patent Abstracts of Japan, Publication No. 05-047666, Date: Feb. 26, 1993.
Related Office Action re Taiwan Application No. 091122351, dated Nov. 20, 2008.
Decision on Rejection for related Chinese Patent Application No. 03816420.5, Dated: Jun. 5, 2009.
Official Notice of Final Decision of Rejection, dated: Feb. 24, 2009 for related Japan Patent Application and Comments, Mar. 24, 2009, pp. 1-2.
Patent Abstracts of Japan, Publication No. 04-128379, Pub. date: Apr. 28, 1992.
Official Notice of Rejection regarding related Japanese Patent Application No. 2004-506067, dated Apr. 28, 2009.
Patent Abstracts of Japan, Publication No. 10-144773, Date: May 29, 1998.
Patent Abstracts of Japan, Publication No. 06-120145, Date: Apr. 28, 1994.
Patent Abstracts of Japan, Publication No. 2002-124479, Date: Apr. 26, 2002.
Patent Abstracts of Japan, Publication No. 09-050965, Date: Feb. 18, 1997.
Patent Abstracts of Japan, Publication No. 07-058041, Date: Mar. 3, 1995.
Official Notice of Decision to Decline the Amendment and Final Decision of Rejection for related Japanese Application No. 2004-506067, dated: Jan. 20, 2010.
European Patent Application No. 02 776 040.4 Office Action dated Jan. 7, 2010.
Office Action from U.S. Appl. No. 10/382,198, Dated: Nov. 27, 2009.
Response to Office Action from U.S. Appl. No. 10/382,198, Dated: Mar. 1, 2010.
Office Action from U.S. Appl. No. 11/483,387, Dated: Apr. 27, 2010.
Office Action from U.S. Appl. No. 10/382,198, Dated: May 3, 2010.
Response to Office Action from U.S. Appl. No. 10/382,198, Dated: Jul. 6, 2010.
Office Action from U.S. Appl. No. 10/382,198, Dated: Jul. 14, 2010.
Response to Office Action from U.S. Appl. No. 10/382,198, Dated: Jul. 19, 2010.
Office Action from U.S. Appl. No. 10/382,198. Dated: Aug. 6, 2010.
Office Action in counterpart European Patent Application No. 02776040 dated Sep. 1, 2010.
Interrogatory in Appeal No. 2009-10287 in counterpart Japanese Patent Application No. 2003-532724 Issued Oct. 1, 2010.
Response to Office Action from U.S. Appl. No. 10/382,198, filed Jan. 4, 2011.
Office Action from U.S. Appl. No. 11/483,387, dated: Jan. 4, 2011.
Office Action from U.S. Appl. No. 10/382,198, dated: Mar. 16, 2011.
Aria et al., Highly Uniform Growth on a Low-Pressure Movpe Multiple Wafer System, Journal of Crystal Growth , 170, pp. 88-91 (1997).
Holstein, "Modeling of Chimney CVD Reactors", Journal of Crystal Growth, 125, pp. 311-319 (1992).
Lee et al., "MOCVD in Inverted Stagnation Point Flow", Journal of Crystal Growth, pp. 120-127 (1886).
Tompa, et al., a Parametric Investigation of GaAs Epitaxial Growth Uniformity in a High Speed, Rotating-Disk MOCVD Reactor, Journal of Crystal Growth 93, (1988) 220-227.
Roc Publication No. 68841, Utility Model, p. 223-225, Jul. 16, 1985.
Office Action of the IPO for related Taiwan Patent Application No. 091122351, dated: Nov. 20, 2008.
A Parametric Investigation of GaAs Epitaxial Growth Uniformity in a High Speed, Rotating-Disk MOCVD Reactor, Journal of Crystal Growth 93, (1988) 220-227.

* cited by examiner

APPARATUS FOR INVERTED MULTI-WAFER MOCVD FABRICATION

This application claims the benefit and filing date of provisional application Ser. No. 60/325,637, which was filed on Sep. 29, 2001.

BACKGROUND OF THE INVENTION

1. Field of the Invention

This invention relates to fabricating semiconductor devices and more particularly to an apparatus for fabricating semiconductor devices using metalorganic chemical vapor deposition (MOCVD).

2. Description of the Related Art

Numerous semiconductor devices can be fabricated in MOCVD systems using different material systems, with MOCVD systems more recently being used to fabricate Group III nitride based devices. Growth of Group III nitride based semiconductor devices in MOCVD systems is generally described in DenBaars and Keller, *Semiconductors and Semimetals*, Vol. 50, Academic Press Inc., 1997, p. 11-35. One of the concerns in fabricating Group III nitride devices is the ability to produce uniform materials with minimal impurities in the device layers, while providing sharp interfaces between layers. Impurities and poor interfaces between layers can negatively impact device performance and can prevent consistent reproduction of semiconductor devices.

Some conventional multi-wafer MOCVD reactors utilize a rotatable susceptor that is mounted at the bottom of the reactor chamber. [See Emcore Discover and Enterprise Series of the TurboDisc Tools, provided by Emcore Inc.]. Semiconductor wafers are held on the top surface of the susceptor and a heating element is arranged below the susceptor to heat the susceptor and the wafers. Reactant growth gasses enter the reactor to deposit the desired materials on the wafer with the susceptor rotating to provide a more uniform deposition of the materials on the wafer.

One the disadvantages of these conventional MOCVD reactors is that a large and non-uniform boundary layer thickness of hot air can form over the wafers and susceptor as a result of the heating of the susceptor. During growth, heat from the susceptor causes gasses to rise and the boundary layers can extend to the top surface of the reactor chamber. Reactant growth gasses are injected into the reactor chamber, usually through a top inlet. When the lower temperature growth gasses encounter the hot gasses heat convention can occur, which causes turbulence within the reactor. This turbulence can result in non-uniform deposition of materials on the wafer. It is also difficult for the deposition gasses to diffuse through a larger boundary layer and as a result, much of the growth gasses do not deposit on the wafers. This increases the amount of growth gasses necessary to form the desired semiconductor device.

A large boundary layer over a susceptor can also limit the susceptor's speed of rotation. As the rotation speed of a heated susceptor is increased, the boundary layer can cause turbulence that adds to the turbulence from the convection forces of the lower temperature growth gasses. This can lead to further non-uniformity in the device layers.

Another disadvantage of conventional MOCVD reactors is that the growth gasses that do not deposit on the wafers (or susceptor) can deposit on the sidewalls or top surface of the reactor chamber above the susceptor. These deposits can adversely impact the reactor's ability to grow good quality layers. The deposits can react with gasses for subsequent layers and redeposit on the wafers during fabrication. The deposits can be introduced as impurities in the subsequent layers and the deposits can reduce the sharpness between layers. This can ultimately limit the reactor's ability to accurately reproduce the semiconductor devices.

A metal organic vapor phase epitaxy (MOVPE) system for the growth of Group III-V compound semiconductor materials is described in Aria et al., *Highly Uniform Growth on a Low-Pressure MOPVE Multiple Wafer System*, Journal of Crystal Growth 170, Pgs. 88-91 (1997). The wafers are held in a susceptor and placed facedown (inverted) in the growth chamber, with the flow gasses flowing under the growth surfaces. The susceptor rotates, thereby rotating the wafers to attain a more uniform growth. Gasses are injected into the chamber from one of the sidewalls of the chamber, through a triple flow channel, and the gas exhaust in on the opposite sidewall. Group V species (hydride gasses) and $H_2$ carrier gas, Group III (organometals) and $H_2$ carrier gas, and purging gas flow into the reactor through the triple flow channel's upper, middle and lower channels, respectively.

One disadvantage this of system is that because the inlet flow channels are on one chamber side wall and the outlet is on the opposite side wall at about the same height, gas flow is created across the chamber between inlet and outlet. Some of the gasses tend to flow through the chamber without having the opportunity to deposit reactants on the wafers. Also, the leading edges of the wafers experience gasses with the highest concentration of reactants, which results in non-uniform deposition across the wafers.

The fluid flow and mass transport for "chimney" chemical vapor deposition (CVD) reactors is discussed in Holstein, *Modeling of Chimney CVD Reactors*, Journal of Crystal Growth 125, Pgs. 311-319 (1992). A chimney reactor has wafers held on heated susceptors (usually two) that are vertically mounted on the interior side walls of the reactor. The intent of the chimney reactor design is to create upward convective gas flow near the susceptor to help promote rapid gas switching for growth of abrupt heterojunctions. A cold carrier gas containing reactants enters at the base of the reactor and flows upward into the heated region.

One of the disadvantages of this design is that asymmetric flow conditions result in the primary gas flow being located near one side of the reactor and reverse flow near the opposite side. This results in different deposition rates at the two susceptors. Also, with upward gas flow, the growth rate uniformity at the leading edge of the susceptor is much greater than at its trailing edge due to depletion of the reactants.

Growth of GaAs based semiconductor devices in an MOCVD reactor is also discussed in Lee et al. *MOCVD in Inverted Stagnation Point Flow*, Journal of Crystal Growth, Pgs 120-127 (1886). The reactor is based on inverted stagnation point flow geometry where the reactants flow up towards wafers clamped to an inverted heated susceptor. However, this reactor is stagnation flow, where the susceptor does not rotate, which can reduce the uniformity of the device layers.

SUMMARY OF THE INVENTION

The present invention seeks to provide an improved method and apparatus for the fabrication of semiconductor devices, and in particular the fabrication of semiconductor devices in MOCVD reactors. One embodiment of a semiconductor fabrication reactor according to the present invention comprises a rotatable susceptor mounted to the top of a reactor chamber. One or more wafers are mounted to a surface of the susceptor and the rotation of the susceptor causes the wafers to rotate within the chamber. A heater heats the susceptor and a chamber gas inlet allows semiconductor growth gasses into the reactor chamber to deposit semiconductor material on said wafers. The inlet is preferably at or below the level of said wafers. A chamber gas outlet is included to allow growth gasses to exit the chamber. The outlet is preferably at or above the level of the wafers.

Another embodiment according to the invention comprises a semiconductor fabrication system that includes a source of gasses for forming epitaxial layers on wafers and a source of gasses for dopants in said epitaxial layers. A gas line carries the dopant and epitaxial source gasses to a reactor for growing semiconductor devices on wafers, and the source gasses in the gas line are injected into the reactor through a reactor inlet. The reactor comprises an inverted susceptor mounted in a reactor chamber that is capable of rotating. One or more wafers are mounted to a surface of the susceptor, the rotation of the susceptor causing the wafers to rotate within the chamber. A heater heats the susceptor and the source gasses deposit semiconductor material on the wafers. A chamber outlet allows the growth gasses to exit the chamber. In a preferred embodiment, the inlet at or below the level of said wafers and the outlet is above the level of said wafers.

In a preferred embodiment according to the invention, the susceptor has a face down surface facing the bottom of said chamber, and the wafers are mounted to the face down surface. As fully described below, by inverting the susceptor the depth of the boundary layer is reduced, which reduces the turbulence generated when lower temperature growth gasses encounter the boundary layer. The growth gasses can also more easily penetrate the boundary layer and the susceptor can be rotated at a higher rotation rate. This arrangement also helps reduce the level of impurities in the semiconductor material that are introduced from deposits within the reactor chamber.

These and other further features and advantages of the invention will be apparent to those skilled in the art from the following detailed description, taken together with the accompanying drawings, in which:

DETAILED DESCRIPTION OF THE INVENTION

Figure 1:
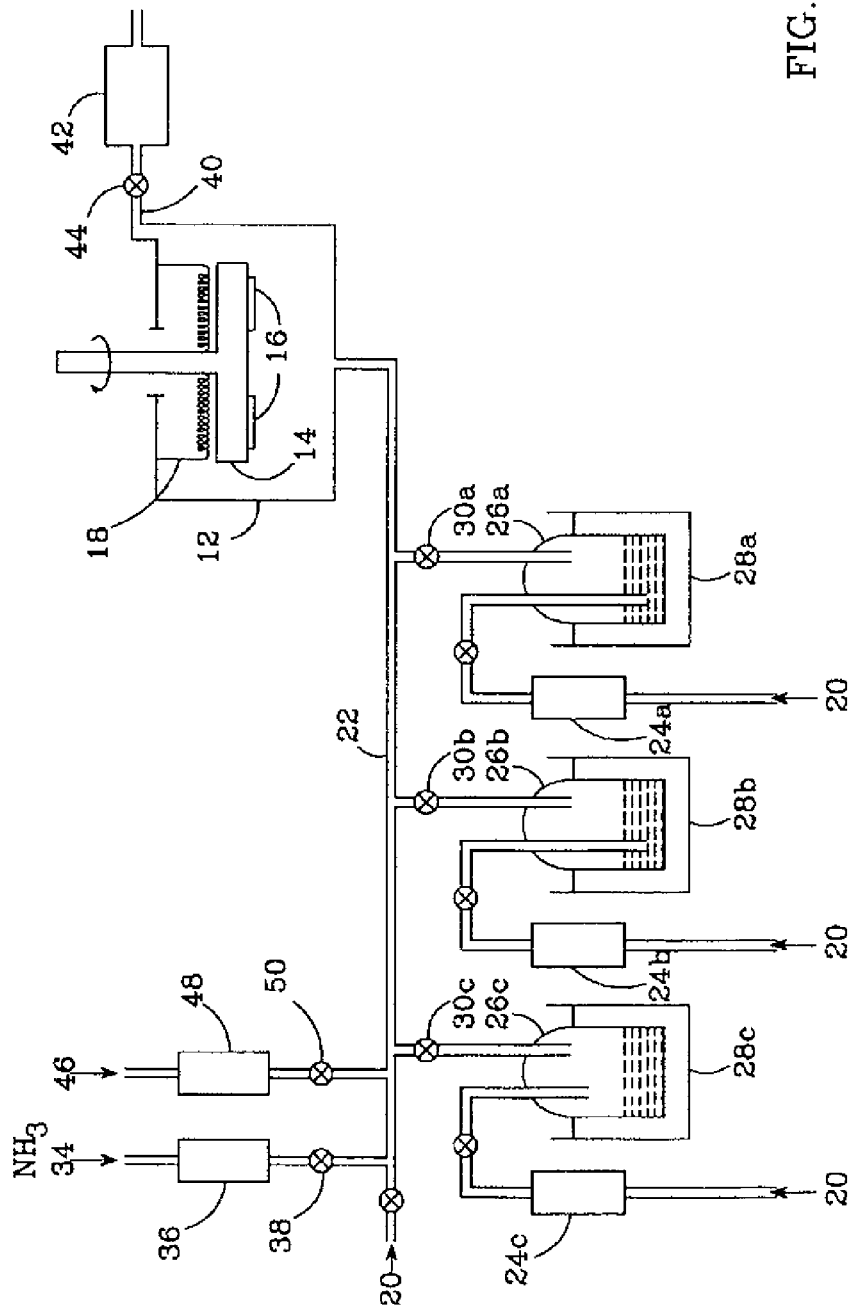
FIG. 1 is a simplified schematic of an embodiment of an MOCVD semiconductor fabrication system according to the present invention.

MOCVD reactors with inverted susceptors according to the present invention can be used in many different semiconductor fabrication systems, but are particularly adapted for use in MOCVD fabrication systems of the type shown in FIG. 1. MOCVD is a nonequilibrium growth technique that relies on vapor transport of precursers and subsequent reactions of Group III alkyls and Group V hydrides in a heated zone. Composition and growth rate are controlled by controlling mass flow rate and dilution of various components of the gas stream to the MOCVD reactor.

Organometallic Group III growth gas sources are either liquids such as trimethylgallium (TMGa) and trimethylaluminum (TMAl), or solids such as trimethylindium (TMIn). The organometallic sources are stored in bubblers through which a carrier gas (typically hydrogen) flows. The bubbler temperature controls the vapor pressure over source material. Carrier gas will saturate with vapor from the organometallic source and transport vapor to the heated substrate.

Group V growth gas sources are most commonly gaseous hydrides, for example $NH_3$ for nitride growth. Dopant materials can be metal organic precursors [diethylzine (DEZn), cyclopenin dienyl magnesium ($Cp_2Mg$)j or hydrides (silane or disilane). Growth gasses and dopants are supplied to the reactor and are deposited as epitaxial layers on a substrate or wafer. One or more wafers are held on a structure of graphite called a susceptor that can be heated by a radio frequency (RF) coil, resistance heated, or radiantly heated by a strip heater, which in turn heats the wafers.

The MOCVD semiconductor fabrication system 10 comprises a reactor chamber 12 having a susceptor 14 that is mounted to the top of the chamber 12 and is inverted. The susceptor 14 can hold a plurality of wafers 16 that can be made of many different materials such as sapphire, silicon (Si), silicon carbide (SiC), aluminum gallium nitride (AlGaN), gallium arsenide (GaAs). For Group III nitride based semiconductor devices a preferred wafer is made of SiC because it has a much closer crystal lattice match to Group III nitrides compared to other materials, which results in Group III nitride films of higher quality. SiC also has a very high thermal conductivity so that the total output power of Group III nitride devices on SiC is not limited by the thermal dissipation of the wafer. The availability of semi insulating SiC wafers also provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. Nos. Re. 34,861; 4,946,547; and 5,200,022.

During growth, the susceptor 14 is heated by heater 18 to maintain wafers 16 at a predetermined temperature. The temperature is typically between 400 and 1200 degrees centigrade (° C.), but can be higher or lower depending on the type of growth desired. The heater 18 can be any of the heating devices listed above, but is usually a radio frequency (RF) or resistance coil.

A hydrogen or nitrogen carrier gas 20 is supplied to a gas line 22. The carrier gas 20 is also supplied through mass flow controllers 24a-c to respective bubblers 26a-c. Bubbler 26a can have an organometallic Group III source as described above. Bubblers 26b and 26c may also contain a similar organometallic compound to be able to grow an alloy of a Group III compound. The bubblers 26a-c are typically maintained at a predetermined temperature by constant temperature baths 28a-c to ensure a constant vapor pressure of the organometallic compound before it is carried to the reactor chamber 12 by the carrier gas 20.

The carrier gas 20 which passes through bubblers 28a-c is mixed with the carrier gas 20 flowing within the gas line 22 by opening the desired combination of valves 30a-c. The mixed gas is then introduced into the reactor chamber 12 through a gas inlet port 32, which can be located at different locations on the reactor, but in the system 10 is located at the bottom of the chamber 12.

A nitrogen containing gas 34 such as ammonia is supplied to the gas line 22 through a mass flow controller 36 and the flow of nitrogen containing gas is controlled by valve 38. If the carrier gas 20 is mixed with the nitrogen containing gas 34, and the organometallic vapor within the gas line 22 is introduced into the reactor chamber 12, the elements are present to grow gallium nitride on the substrates 16 through thermal decomposition of the molecules in the organometallic and nitrogen containing gas.

To dope alloys of gallium nitride on the wafers 16, one of the bubblers 26a-c not being used for the organometallic compounds, can be used for a dopant material. Many different doping materials can be used such as beryllium, calcium, zinc, or carbon, with preferred materials being magnesium (Mg) or silicon (Si). Bubbler 26b or 26c can be used for an alloy material such as boron, aluminum, indium, phosphorous, arsenic or other materials. Once the dopant and/or alloy are selected and the appropriate valve 30a-c is opened to allow the dopant to flow into gas line 22 with the organometallic and nitrogen containing gas 34, the growth of the doped layer of gallium nitride can take place on substrates 16.

The gas within the reactor chamber 12 can be purged through a gas purge line 40 connected to a pump 42 operable under hydraulic pressure. Further, a purge valve 44 allows gas pressure to build up or be bled off from the reactor chamber 12.

The growth process is typically stopped by shutting off the organometallic and dopant sources by closing valves 30a-c, and keeping the nitrogen containing gas 36 and the carrier gas 20 flowing. Alternatively, the reactor chamber 12 can be purged with a gas 46 that can be controlled through a mass flow controller 48 and valve 50. The purge is aided by opening valve 44 to allow the pump 42 to evacuate the reaction chamber 12 of excess growth gasses. Typically, the purge gas 46 is hydrogen, but can be other gasses. Turning off power to the heater 18 then cools the substrates 16.

Figure 2:
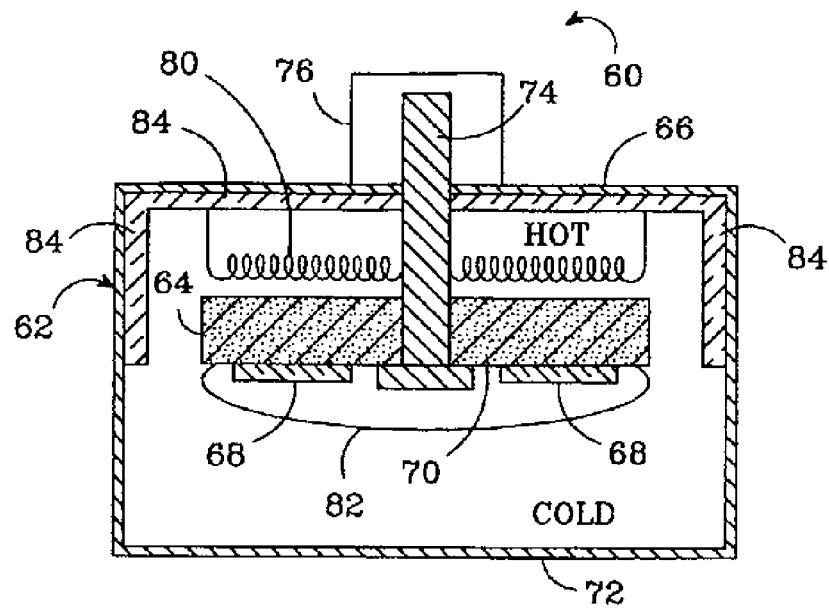
FIG. 2 is a sectional view of one embodiment of a reactor according to the present invention.

FIG. 2 shows one embodiment of a MOCVD reactor 60 in accordance with the present invention. The reactor 60 can be used to fabricate many different semiconductor devices from different material systems, but is particularly applicable to fabricating devices from the Group III nitride material system and its alloys, in an MOCVD fabrication system.

The reactor 60 comprises a reactor chamber 62, with a susceptor 64 that is, inverted and mounted from the reactor's top surface 66. The susceptor 64 can be made of many heat conductive materials, with a suitable material being graphite. Semiconductor wafers 68 are mounted on the susceptor's face down surface 70 that faces the chamber's bottom surface 72, with typical susceptors capable of holding approximately six three inch wafers and up to eighteen two inch wafers. The wafers can be held to the susceptor surface 70 by many different mechanisms including, but not limited to, mounting faceplates, clamps, clips, adhesives, tape, etc.

The susceptor 64 is held within the reactor chamber 60 by a rotation rod 74 that can be rotated so that the susceptor 64 is also rotated. The susceptor is heated by a heating element 80 that is arranged between the susceptor 64 and the chamber's top surface. The heater 80 can be any of the heating devices listed above, but is usually a radio frequency (RF) or resistance coil. When the heater 80 heats the susceptor 64, a hot gas boundary layer 82 forms over the susceptor surface 70 and the wafers 68. During growth of semiconductor material on the wafers 68, the growth gasses can enter the chamber 62 in many different ways and through different walls of the chamber 62.

By inverting the susceptor, the depth of the boundary layer 82 is reduced compared to conventional reactor chambers that have a susceptor at the bottom. As the susceptor 64 is heated and generates hot gas, the heated gas rises. Accordingly, the boundary layer 82 is compressed against the susceptor 64 and wafers 68 by the rising of the hot gas. The reduced boundary layer height reduces the turbulence generated when lower temperature growth gasses encounter the boundary layer 82, which allows for more uniform deposition of materials on the wafers 68. The growth gasses can also more easily penetrate the boundary layer 82 and as a result, more of the growth gasses deposit on the wafers 68. This decreases the amount of deposition gasses necessary to form the desired semiconductor device.

The reduced boundary layer also reduces gas convection that can occur when the susceptor 64 rotates. As a result, the susceptor 64 can be rotated much faster than conventionally arranged susceptors. In the reactor 10, the susceptor can be rotated above 100 revolutions per minute (rpm) and up to several thousand rpm.

The reduced boundary layer 82 also allows the deposition gasses to deposit on the wafers 68 under increased reactor chamber pressure to further facilitate efficient fabrication. Depending on the device being fabricated, the pressure can be below 1/8 of an atmosphere to more that 10 atmospheres.

Another advantage of the inverted susceptor arrangement is that most of the growth gasses that do not deposit on the wafers rise past the susceptor 64 toward the top of the chamber 62. These gasses can form deposits 84 on the side walls and top surface of the chamber 62 behind the susceptor. These deposits are less likely to interact with subsequent growth gasses to introduce impurities into the material deposited on the wafers 68 because the growth gasses will not encounter these deposits until they are past the wafers. That is, the gasses encounter these impurities when they are past the point when they are depositing reactants on the wafers. Gasses that do not deposit on the wafers or reactor walls can exit the chamber through a top gas outlet, although the outlet could at different locations on the chamber.

Figure 3:
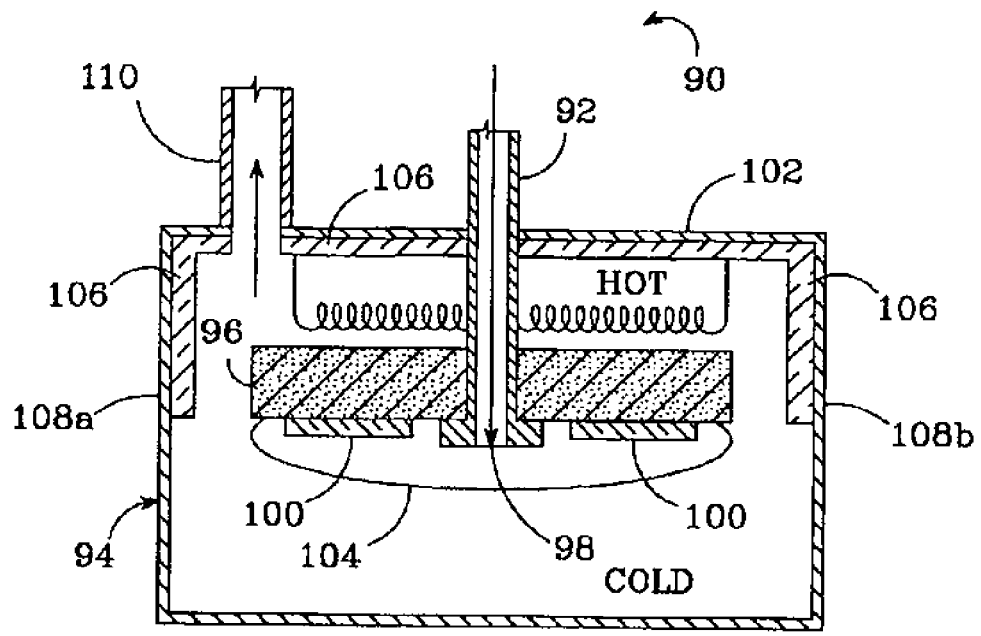
FIG. 3 is a sectional view of another embodiment of a reactor according to the present invention having a central rotation rod gas inlet.

FIG. 3 shows an embodiment of an MOCVD reactor 90 in accordance with the present invention that is similar to the reactor 60 in FIG. 2. The reactor has a rotation rod 92 that is hollow so that deposition gasses can enter the reactor chamber 94 through the rotation rod 92.

Figure 4:
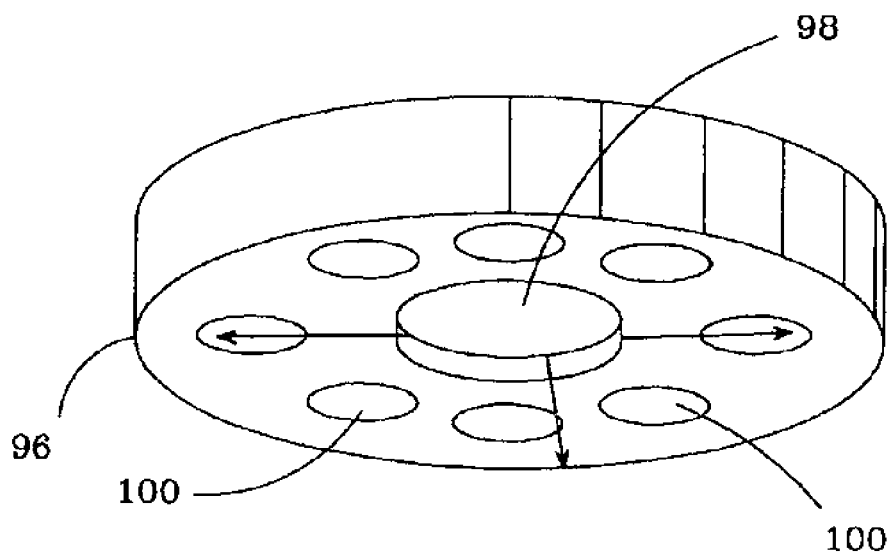
FIG. 4 is a below perspective view of an embodiment of a susceptor according to the present invention that can be used in the reactor in FIG. 3.

FIG. 4 shows a susceptor 96 that can be used in reactor 90, which includes a central gas inlet 98 that allows gas from the rotation rod 92 to enter the reactor chamber 94 through the susceptor 96. As the susceptor 96 rotates, the gasses from the inlet are drawn to the susceptor's perimeter and along the way, some of the growth gasses deposit on the wafers 100. Gasses that do not deposit on the wafers, pass off the edge of the susceptor 96 and are drawn toward the chamber's top surface 102. Like above, these gasses can form deposits 106 on the inside of the chamber's sidewalls 108a, 108b and inside of the chamber's top surface 102, that are downstream and behind the susceptor 96. These deposits are less likely to adversely effect the fabrication of subsequent layers as described above. Gasses can exit the reactor chamber 94 through a gas outlet 110 that is preferably at the top of the reactor chamber, which promotes flow of the gasses past the wafers and then to the top of the chamber.

Figure 5:
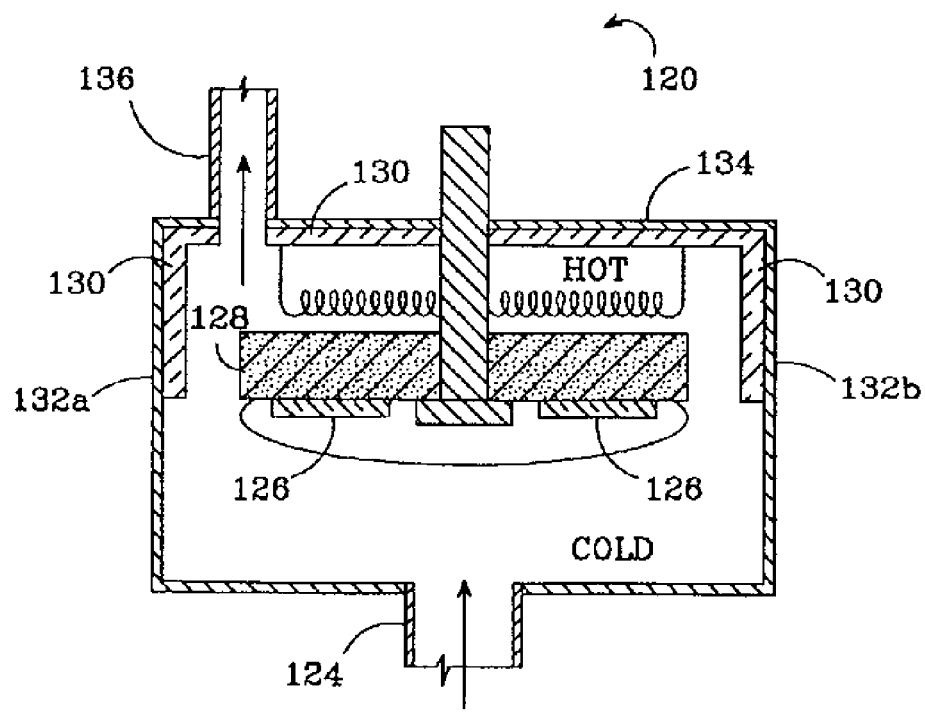
FIG. 5 is a sectional view of another embodiment of a reactor according to the present invention having a central bottom gas inlet.

FIG. 5 shows another embodiment of an MOCVD reactor 120 in accordance with the invention, where the growth gasses enter the chamber 122 through a central bottom inlet 124 that is directed toward the wafers 126 on the rotating susceptor 128. The growth gasses rise toward the susceptor 128 where gasses are deposited on the wafers 126. Like the embodiment in FIG. 3, any gasses that do not deposit on the wafers 126 are drawn past the susceptor 128 where they can form deposits 130 on the inside of the chamber's sidewalls 132a, 132b and inside of the chamber's top surface 134. The reactor also has a top gas outlet 136.

Figure 6:
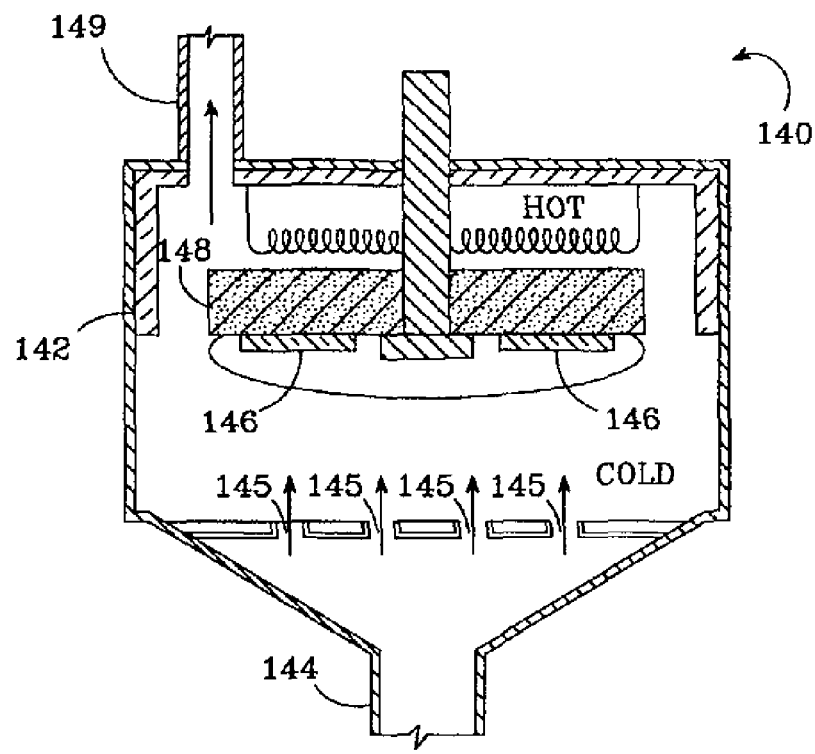
FIG. 6 is a sectional view of another embodiment of a reactor according to the present invention having bottom showerhead gas inlet.

FIG. 6, shows another embodiment of an MOCVD reactor 140 in accordance with the present invention, where the growth gasses enter the reactor chamber 142 through a bottom "showerhead" inlet 144. The inlet 144 has multiple bore-holes 145 for the growth gasses to pass into the chamber where they rise toward the wafers 146 on the rotating susceptor 148. The bore-holes 145 in the inlet 144 provide for a more uniform application of the growth gasses across the susceptor 148, which provides for a more uniform deposition of materials on the wafers 146. Like above, the gasses that do not deposit on the wafers are drawn downstream and if they do not deposit on the walls of the reactor chamber 142, they can exit the chamber through the top outlet 149.

Figure 7:
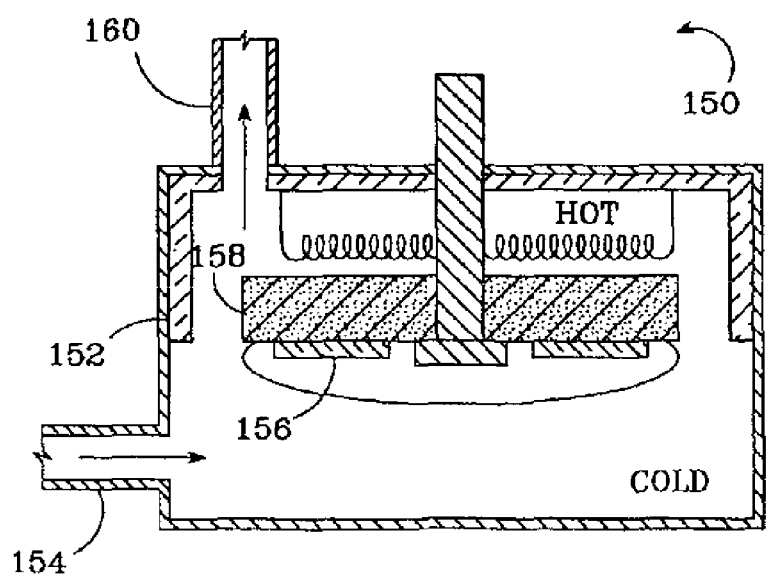
FIG. 7 is a sectional view of another embodiment of a reactor according to the present invention having sidewall gas inlet.

FIG. 7 shows another embodiment of an MOCVD reactor 150 in accordance with the present invention, where the deposition gasses enter the reactor chamber 152 through a sidewall inlet 154. Like above, the gasses that do not deposit on the wafers 156 on the rotating susceptor 158 are drawn downstream where they can form deposits 159 on the inside of the reactor's walls. The reactor can also have a top gas outlet 160, which is arranged so that the gasses pass from the inlet 154 toward the top of the chamber 152. The growth gasses rise toward the susceptor 158 where semiconductor material can be deposited on the wafers 156.

Figure 8:
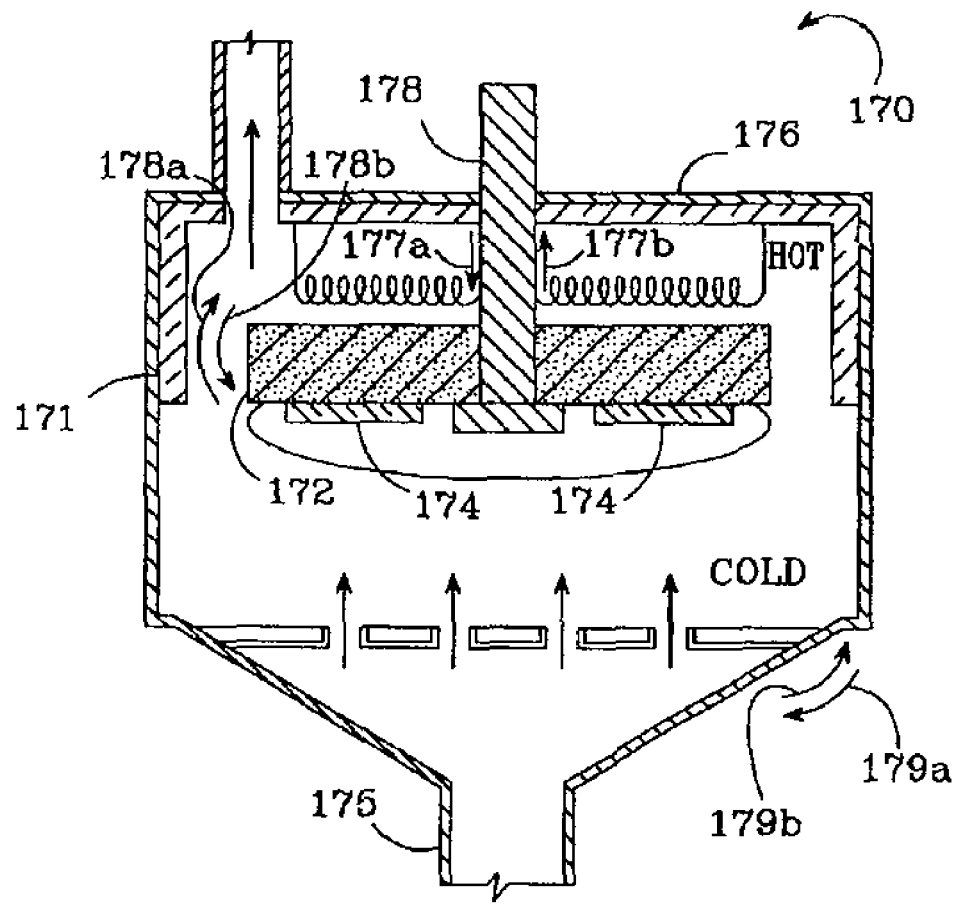
FIG. 8 is a sectional view of another embodiment of a reactor according to the present invention having a height adjustable susceptor.

FIG. 8 shows still another embodiment of an MOCVD reactor 170 in accordance with the present invention, that includes a reactor chamber 171, rotating susceptor 172, wafers 174 on the susceptor, and a showerhead gas inlet 175, all of which are similar those in reactor 140 of FIG. 6. In most respects, the reactor 170 operates in the same way as the reactor 140 in FIG. 6. However, in reactor 170 the susceptor 172 is mounted to the reactor's top surface 176 by a rod 178 that is movable in directions shown be arrows 177a, 177b, to adjust the distance between the showerhead inlet 175 and the susceptor 172. This adjustment can vary the concentration of reactants in the growth gasses that react with the wafers 174, to vary the semiconductor growth conditions and rate.

As further shown in FIG. 8 the susceptor 172 can be further adjusted in the direction of arrows 178a, 178b to vary the angle between the susceptor 172 and the gas inlet 175. Similarly, the angle of the gas inlet 175 can be adjusted in the direction of arrows 179a, 179b to also adjust the angle between the susceptor 172 and the inlet 175. These adjustments can also vary the semiconductor grown conditions and rate on the wafers 174. The movable susceptor arrangement and angle adjustable susceptor and inlet arrangement can also be used in reactors 60, 120, 150, above that have gas inlets through the susceptor, a bottom inlet and a side inlet, respectively. The reactors can include only one or all of these adjustment options.

Although the present invention has been described in considerable detail with reference to certain preferred configurations thereof, other versions are possible. Many different gas inlets, gas outlets and susceptors can be used. The gas inlets and outlets can be arranged in many different locations. The reactor according to the invention can be used to grow many different semiconductor devices from many different material systems, in many different semiconductor fabrication systems. Therefore, the spirit and scope of the invention should not be limited to the preferred versions in the specification above or in the claims below.

We claim:

1. A semiconductor fabrication reactor, comprising:
   a rotatable susceptor mounted to a top surface of a reactor chamber, said reactor chamber having a bottom surface opposite said top surface, said susceptor having a face down surface that faces toward said bottom surface;
   first and second sidewalls arranged between said top surface and said bottom surface, said susceptor arranged between said sidewalls and arranged between said top surface and said bottom surface;
   a plurality of wafers mounted to said susceptor's face down surface, the rotation of said susceptor causing said wafers to rotate within said chamber;
   a heater remote to said susceptor and arranged to heat said susceptor;
   one or more chamber gas inlets, each of which allows semiconductor growth gasses into said reactor chamber to deposit semiconductor material on said wafers, each of said inlets below said face down surface;
   a chamber gas outlet through said top surface arranged to allow gases to exit from the interior of said reactor chamber, said gas outlet arranged to open to said reactor chamber interior such that gases enter said gas outlet at a location entirely above said susceptor;
   wherein said chamber gas outlet is coupled to said top surface and said chamber gas outlet is arranged entirely above said sidewalls;
   wherein said top surface is arranged entirely above said susceptor; and
   wherein said inlet and outlet are arranged to produce a gas flow up from said one or more inlets, over said wafers, and out said outlet so that growth gasses that do not deposit on said wafers are drawn above said face down surface, such that growth gas impurities are primarily deposited on the surfaces of said reactor chamber above said face down surface.

2. The reactor of claim 1, wherein said chamber gas inlet(s) is through said bottom surface of said reactor chamber.

3. The reactor of claim 1, wherein said chamber gas inlet(s) is a single inlet through the approximate center of said bottom surface of said chamber.

4. The reactor of claim 1, wherein said chamber gas inlet(s) is a showerhead inlet through said bottom surface of said chamber, said showerhead inlet having a plurality of bore-holes to allow said growth gasses into said chamber.

5. The reactor of claim 1, further comprising a rotation rod connected through said top surface of said chamber, said susceptor attached to said rotation rod, the rotation of said rotation rod causing said susceptor to rotate in said chamber.

6. The reactor of claim 5, wherein said rod is hollow and wherein said inlet(s) comprises a central inlet in a surface of said susceptor in alignment with said rod, said growth gasses entering said chamber through said rod and central inlet.

7. The reactor of claim 1, wherein said chamber gas inlet(s) is through at least one of said sidewalls of said reactor chamber.

8. The reactor of claim 1, wherein said susceptor can be moved up and down to vary the distance between said inlet and said susceptor.

9. The reactor of claim 1, wherein the angle of said susceptor can be adjusted to adjust the angle between said inlet and said susceptor.

10. The reactor of claim 1, wherein the angle of said inlet can be adjusted to adjust the angle between said inlet and said susceptor.

11. A semiconductor fabrication system, comprising:
a source of gasses for forming epitaxial layers on wafers;
a source of gasses for dopants in said epitaxial layers;
a gas line for carrying said dopant and epitaxial source gasses; and
a reactor for growing semiconductor devices on wafers, said reactor comprising:
an inverted susceptor mounted in a reactor chamber to a top surface of said chamber, said reactor chamber having a bottom surface opposite said top surface, said susceptor capable of rotating and said source gasses in said gas line injected into said reactor chamber through a reactor inlet;
said reactor chamber comprising first and second sidewalls arranged between said top surface and said bottom surface, said susceptor arranged between said sidewalls and arranged between said top surface and said bottom surface;
a plurality of wafers mounted to a surface of said susceptor, the rotation of said susceptor causing said wafers to rotate within said chamber;
a heater remote to said susceptor and arranged to heat said susceptor, said source and dopant gasses depositing semiconductor material on said wafers, said inlet at or below the level of said wafers; and
a chamber outlet through said chamber top surface arranged to form a conduit for transmitting source gasses injected into said reactor from an interior of said chamber to an exterior of said chamber, said chamber outlet arranged to open to said reactor chamber interior such that source gasses enter said chamber outlet at a location entirely above said susceptor,
wherein said chamber outlet is coupled to said top surface and said chamber outlet is arranged entirely above said sidewalls,
wherein said top surface is arranged entirely above said susceptor,
wherein said inlet and outlet are arranged such that gases enter said reactor chamber through said reactor inlet only from below said wafers and exit said reactor chamber at a point entirely above said wafers producing a gas flow up from said one or more inlets, over said wafers, and out said outlet, such that gas impurities are primarily deposited on the surfaces of said reactor above said wafers.

12. The system of claim 11, wherein said susceptor has a face down surface facing said bottom surface of said chamber, said wafers mounted to said face down surface.

13. The system of claim 11, wherein said reactor inlet is a single inlet through said bottom surface of said chamber.

14. The system of claim 11, wherein said reactor inlet is a showerhead inlet through said bottom surface of said chamber, said showerhead inlet having a plurality of boreholes to allow said growth gasses into said chamber.

15. The system of claim 11, further comprising a rotation rod connected to the top of said reactor chamber, said susceptor attached to said rotation rod, the rotation of said rotation rod causing said susceptor to rotate in said chamber.

16. The system of claim 15, wherein said rod is hollow and wherein a surface of said susceptor has a central inlet in alignment with said rod, said growth gasses entering said chamber through said rod and central inlet.

17. The system of claim 11, wherein said reactor inlet is through at least one of said sidewalls of said reactor chamber.

18. The system of claim 11, wherein said susceptor can be moved up and down to vary the distance between said inlet and said susceptor.

19. The system of claim 11, wherein the angle of said susceptor can be adjusted to adjust the angle between said inlet and said susceptor.

20. The system of claim 11, wherein the angle of said inlet can be adjusted to adjust the angle between said inlet and said susceptor.

21. A metalorganic chemical vapor deposition (MOCVD) semiconductor fabrication reactor, comprising:
a susceptor mounted to a top surface of a MOCVD reactor chamber, said reactor chamber having a bottom surface opposite said top surface;
said reactor chamber comprising first and second sidewalls arranged between said top surface and said bottom surface, said susceptor arranged between said sidewalls and arranged between said top surface and said bottom surface;
a plurality of wafers mounted to a surface of said susceptor;
a means for causing said susceptor to rotate, the rotation of said susceptor causing said wafers to rotate;
a means for remotely heating said susceptor, said susceptor arranged within said chamber so that the boundary layer caused by the heating of said susceptor is compressed;
an inlet means for semiconductor growth gasses to enter said reactor chamber to deposit semiconductor material on said wafers;
an outlet means through said chamber top surface and entirely above the level of said wafers, for growth gasses to enter said outlet means and exit said chamber from a location that is downstream and beyond said susceptor;
wherein said outlet means is coupled to said top surface and said outlet means is arranged entirely above said sidewalls;
wherein said top surface is arranged entirely above said susceptor; and
wherein said inlet means and outlet means are arranged such that gases enter said reactor chamber only from a point below said wafers and exit said reactor chamber at a point above said wafers, to produce a gas flow from said inlet means, over said wafers, and out said outlet means such that gas impurities are primarily deposited on walls of said reactor chamber above said wafers.

22. The reactor of claim 21, wherein said inlet means comprises a single inlet through said bottom surface of said chamber.

23. The reactor of claim 21, wherein said inlet means comprises a showerhead inlet through said bottom surface of said chamber, said showerhead inlet having a plurality of boreholes to allow said growth gasses into said chamber.

24. The reactor of claim 21, wherein said susceptor is mounted within said reactor by a hollow rotatable rod, the rotation of said rod causing said susceptor to rotate, said inlet means comprising an inlet in said susceptor in alignment with said rod, said growth gasses entering said reactor through said rod and susceptor inlet.

25. The reactor of claim 21, wherein said susceptor can be moved up and down and tilted side to side to vary the conditions for said deposition of semiconductor materials from said growth gasses.

26. The reactor of claim 21, wherein said inlet means can be tilted side to side to vary the conditions for the said deposition of semiconductor materials from said growth gasses.

27. The reactor of claim 21, wherein said inlet means is at or below said wafers.

28. A metalorganic chemical vapor deposition (MOCVD) semiconductor fabrication system, comprising:
a source of gasses for forming epitaxial layers on wafers;
a source of gasses for dopants in said epitaxial layers;

an MOCVD reactor for growing semiconductor devices on wafers, said reactor comprising a reactor chamber partially defined by top and bottom opposing surfaces, said source gasses injected into said chamber through an inlet, said reactor further comprising:
- an inverted susceptor mounted at said top surface of said chamber, said susceptor capable of rotating;
- first and second sidewalls arranged between said top and bottom opposing surfaces, said susceptor arranged between said sidewalls and arranged between said top and bottom opposing surfaces;
- one or more wafers mounted to a face down surface of said susceptor, the rotation of said susceptor causing said wafer(s) to rotate within said chamber, said inlet below said wafer(s);
- a heater remote to said susceptor and arranged to heat said susceptor, said source gasses depositing semiconductor materials on said wafer(s); and
- a gas outlet through said chamber top surface and positioned above said wafer(s) having an exit point from said chamber that is arranged above the bottom edge of said susceptor to allow said dopants and epitaxial gasses to enter said gas outlet and to exit said reaction chamber only above the bottom edge of said susceptor,
- wherein said gas outlet is coupled to said top opposing surface and said gas outlet is arranged entirely above said sidewalls,
- wherein said top opposing surface is arranged entirely above said susceptor;
- wherein said inlet and outlet are arranged such that gases enter said reactor chamber only at a point below said susceptor and exit said reactor chamber at a point above said susceptor, the gas from said inlet traveling up past and over said wafer(s) and out said outlet.

29. The system of claim 28, wherein said reactor inlet is a showerhead inlet through said bottom surface of said chamber, said showerhead inlet having a plurality of boreholes to allow said growth gasses into said chamber.

30. The system of claim 28, wherein said susceptor can be moved up and down to vary the distance between said inlet and said susceptor.

31. A semiconductor fabrication reactor, comprising:
- a susceptor mounted to a top surface of a reactor chamber, said reactor chamber having a bottom surface opposite said top surface, said susceptor having a face down surface that faces said bottom surface;
- first and second sidewalls arranged between said top surface and said bottom surface, said susceptor arranged between said sidewalls and arranged between said top surface and said bottom surface;
- a plurality of wafers mounted to said susceptor's face down surface;
- an RF coil arranged within said reactor chamber to heat said susceptor;
- a chamber gas inlet to allow semiconductor growth gasses into said reactor chamber, said inlet at or below the face down surface;
- a chamber gas outlet through said chamber top surface arranged to allow gases to exit from the interior of said reactor chamber, said gas outlet arranged to open to said reactor chamber interior such that gases enter said chamber gas outlet at a location entirely above said susceptor;
- wherein said gas outlet is coupled to said top surface and said gas outlet is arranged entirely above said sidewalls;
- wherein said top surface is arranged entirely above said susceptor; and
- wherein said inlet and outlet produce a gas flow so that growth gasses not deposited on said wafers are drawn above said face down surface, such that growth gas impurities are primarily deposited on the walls of said reactor above said face down surface.

32. A semiconductor fabrication reactor, comprising:
- a susceptor mounted to a top surface of a reactor chamber;
- first and second sidewalls arranged below said top surface, said susceptor arranged between said sidewalls and extending below said top surface;
- an RF coil remote to said susceptor and arranged between said top surface and said susceptor to heat said susceptor and establish a compressed boundary layer;
- a plurality of wafers mounted to a surface of said susceptor;
- an inlet means for semiconductor growth gasses to enter said reactor chamber to deposit semiconductor material on said wafers;
- an outlet means through said chamber top surface completely above the level of said wafers, for growth gasses to enter said outlet means and to exit said chamber from a location that is above said susceptor;
- wherein said outlet means is coupled to said top surface and said outlet means is arranged entirely above said sidewalls;
- wherein said top surface is arranged entirely above said susceptor; and
- wherein said inlet means and outlet means are arranged such that gases enter said reactor chamber through said inlet at a point below said wafers, flows up and over said wafers, out said outlet and exits said reactor chamber at a point above said wafers, such that gas impurities are primarily deposited on walls of said reactor chamber above said wafers.

33. The reactor of claim 1, wherein the chamber gas outlet extends above the top surface.

34. The reactor of claim 1, wherein the chamber gas outlet comprises an opening that is arranged within the top surface.

35. The reactor of claim 1, wherein the heater is arranged between the top surface and the susceptor.

36. The system of claim 11, wherein the chamber outlet extends above the top surface.

37. The system of claim 11, wherein the chamber outlet comprises an opening that is arranged within the top surface.

38. The system of claim 11, wherein the heater is arranged between the top surface and the susceptor.

39. The reactor of claim 21, wherein the outlet means extends above the top surface.

40. The reactor of claim 21, wherein the outlet means comprises an opening that is arranged within the top surface.

41. The reactor of claim 21, wherein the remotely heating means is arranged between the top surface and the susceptor.

42. The system of claim 28, wherein the gas outlet extends above the top opposing surface.

43. The system of claim 28, wherein the gas outlet comprises an opening that is arranged within the top opposing surface.

44. The system of claim 28, wherein the heater is arranged between the top opposing surface and the susceptor.

45. The reactor of claim 31, wherein the gas outlet extends above the top surface.

46. The reactor of claim 31, wherein the gas outlet comprises an opening that is arranged within the top surface.

47. The reactor of claim 31, wherein the RF coil is arranged between the top surface and the susceptor.

48. The reactor of claim 32, wherein the outlet means extends above the top surface.

49. The reactor of claim 32, wherein the outlet means comprises an opening that is arranged within the top surface.

50. The reactor of claim 32, wherein the RF coil is arranged between the top surface and the susceptor.

51. The reactor of claim 1, wherein said top surface is arranged entirely above said heater.

52. The reactor of claim 1, wherein said susceptor comprises a top susceptor surface opposite said face down surface, wherein said chamber gas outlet faces toward said top susceptor surface.

53. The reactor of claim 1, wherein said susceptor is partially arranged between said chamber gas outlet and said bottom surface.

54. The reactor of claim 1, wherein said chamber gas outlet extends perpendicular from said top surface.

55. The system of claim 11, wherein said top surface is arranged entirely above said heater.

56. The system of claim 11, wherein said surface of said susceptor comprises a face down surface that faces toward said bottom surface, and said susceptor further comprises a top susceptor surface opposite said face down surface, wherein said chamber outlet faces toward said top susceptor surface.

57. The system of claim 11, wherein said susceptor is arranged between said chamber outlet and said bottom surface.

58. The system of claim 11, wherein said chamber outlet extends perpendicular from said top surface.

59. The reactor of claim 21, wherein said top surface is arranged entirely above said means for remotely heating said susceptor.

60. The reactor of claim 21, wherein said surface of said susceptor comprises a face down surface that faces toward said bottom surface, and said susceptor further comprises a top susceptor surface opposite said face down surface, wherein said outlet means faces toward said top susceptor surface.

61. The reactor of claim 21, wherein said susceptor is arranged between said outlet means and said bottom surface.

62. The reactor of claim 21, wherein said outlet means extends perpendicular from said top surface.

63. The system of claim 28, wherein said top opposing surface is arranged entirely above said heater.

64. The system of claim 28, wherein said face down surface faces toward said bottom opposing surface and said susceptor further comprises a top susceptor surface opposite said face down surface, and wherein said gas outlet faces toward said top opposing surface.

65. The system of claim 28, wherein said susceptor is partially arranged between said gas outlet and said bottom opposing surface.

66. The system of claim 28, wherein said gas outlet extends perpendicular from said top opposing surface.

67. The reactor of claim 31, wherein said top surface is arranged entirely above said RF coil.

68. The reactor of claim 31, wherein said susceptor comprises a top susceptor surface opposite said face down surface, wherein said chamber gas outlet faces toward said top susceptor surface.

69. The reactor of claim 31, wherein said susceptor is arranged between said chamber gas outlet and said bottom surface.

70. The reactor of claim 31, wherein said chamber gas outlet extends perpendicular from said top surface.

71. The reactor of claim 32, wherein said top surface is arranged entirely above said RF coil.

72. The reactor of claim 32, wherein said surface of said susceptor comprises a face down surface that faces toward a bottom surface of said reactor chamber, and said susceptor further comprises a top susceptor surface opposite said face down surface, wherein said outlet means faces toward said top susceptor surface and wherein said top surface is arranged opposite said bottom surface.

73. The reactor of claim 32, wherein said susceptor is arranged between said outlet means and a bottom surface of said reactor chamber, wherein said top surface is arranged opposite said bottom surface.

74. The reactor of claim 32, wherein said outlet means extends perpendicular from said top surface.

* * * * *

UNITED STATES PATENT AND TRADEMARK OFFICE
CERTIFICATE OF CORRECTION

| | | |
|---|---|---|
| PATENT NO. | : 8,133,322 B2 | Page 1 of 1 |
| APPLICATION NO. | : 10/256814 | |
| DATED | : March 13, 2012 | |
| INVENTOR(S) | : Nakamura et al. | |

It is certified that error appears in the above-identified patent and that said Letters Patent is hereby corrected as shown below:

column 13, claim 57, line 1, before "arranged", add --partially--
    column 13, claim 61, line 1, before "arranged", add --partially--

Signed and Sealed this
Fifth Day of June, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,133,322 B2 | Page 1 of 1 |
| APPLICATION NO. | : 10/256814 | |
| DATED | : March 13, 2012 | |
| INVENTOR(S) | : Nakamura et al. | |

It is certified that error appears in the above-identified patent and that said Letters Patent is hereby corrected as shown below:

Column 13, line 24 (claim 57, line 1) before "arranged", add --partially--
Column 13, line 38 (claim 61, line 1) before "arranged", add --partially--

This certificate supersedes the Certificate of Correction issued June 5, 2012.

Signed and Sealed this
Third Day of July, 2012

David J. Kappos
*Director of the United States Patent and Trademark Office*